United States Patent [19]

Bloch

[11] Patent Number: 4,606,591
[45] Date of Patent: Aug. 19, 1986

[54] LOCK/EJECTOR SYSTEM FOR PRINTED WIRING BOARD

[75] Inventor: Kenneth A. Bloch, Monrovia, Calif.

[73] Assignee: Burroughs Corporation, Detroit, Mich.

[21] Appl. No.: 712,837

[22] Filed: Mar. 18, 1985

[51] Int. Cl.$^4$ ............................................. H01R 13/62
[52] U.S. Cl. ................................ 339/45 M; 339/91 R; 339/75 M
[58] Field of Search ............ 339/45, 46, 75 R, 75 M, 339/91 R

[56] References Cited

U.S. PATENT DOCUMENTS

| | | | |
|---|---|---|---|
| 3,311,863 | 3/1967 | Beale | 339/45 M |
| 3,451,034 | 6/1969 | Beale | 339/45 R |
| 4,083,616 | 4/1978 | McNiece et al. | 339/45 M |
| 4,223,646 | 11/1980 | Leung et al. | 339/45 M |
| 4,313,150 | 1/1982 | Chu | 339/45 M |
| 4,521,063 | 6/1985 | Milc | 339/45 M |

FOREIGN PATENT DOCUMENTS

| | | | |
|---|---|---|---|
| 119952 | 9/1984 | European Pat. Off. | 339/75 M |
| 2850440 | 5/1979 | Fed. Rep. of Germany | 339/45 M |

Primary Examiner—Gil Weidenfeld
Assistant Examiner—David L. Pirlot
Attorney, Agent, or Firm—Alfred W. Kozak; Nathan Cass; Kevin R. Peterson

[57] ABSTRACT

A lock/ejector assembly device for attachment to a printed wiring board. Attachment of an upper and lower such assembly device to a printed wiring board provides locking pressure for stably fixing the printed wiring board into a rack which holds the mother board and its multiple interconnection contacts. A finger-movable snap lock in the assembly provides a "locking" function to fixate the board, or an "unlocking" function to permit removal of the board.

5 Claims, 5 Drawing Figures

LOCKED.

UNLOCKED.

LOCKED.

LOCK/EJECTOR SYSTEM FOR PRINTED WIRING BOARD

FIELD OF THE INVENTION

This disclosure relates to methods and means for stabilizing and locking the insertion of and facilitating the removal of printed wiring board in guide slots which connect into a backplane mother board.

BACKGROUND OF THE INVENTION

In the art of electronic module assemblies it has become standard practice to provide modular cabinetry whereby a backplane mother board provides a connective nesting ground for a series of slide-in printed wiring boards, often called "daughter-boards".

Very often such cabinetry may involve a series of guide slides whereby 15 or 20 or more printed wiring boards must be guided and connected to the backplane mother board. Sometimes the printed wiring boards which are inserted are of considerable large size having multiple numbers of electronic components and cooling devices which may have a weight of 10 to 15 pounds or more per single printed wiring board.

In any case, it has long been a problem of how to insure that the printed wiring board will remain stably connected to the backplane mother board in a vibration-free condition, whereby jars or bumps or vibratory situations will not cause damage to the printed wiring board, nor loosen its connective contact with the backplane mother board.

Additionally, another problem is to provide for the easy removal of the printed wiring boards from the mother board when it is desired to disconnect the mother board and remove it from the assembly. This must be done with sufficient capability so as not to damage the printed wiring board while attempting removal of the board.

To this end, the following described system for locking/ejection of a printed wiring board has been developed which will efficiently and inexpensively solve the problems of vibration stability and lock-in of even a large size printed wiring board, in addition to providing easy ejectability.

In the prior art the problems of extracting a printed circuit board or printed wiring board from its guiding slot and connection have been sufficiently recognized as to require different types of "extractor" mechanisms. Other prior art operations have recognized the problems of insertion of large size printed wire boards which require considerable force to make a proper connection. Certain manufacturers have attempted to provide insertion devices to permit leverage to the printed wiring board which will allow the heavy connecting forces to be overcome easily in order to provide a solid set of connections to the mother board. For example, one printed wiring board connected to a mother board backplane may have over 200 interconnect contacts.

Likewise, after a large size printed wiring board has been inserted into its mother board, it may require considerable force just to merely break the connection and eject the printed wiring board. This again is a problem to which design attention must be devoted.

These large scale problems of insertion and ejection of printed wiring boards in multiple assembly can now be handled in a most simple and uniform manner without undue expense by means of the presently disclosed combination of a lock/ejector system described herein.

SUMMARY OF THE INVENTION

The present disclosure presents a lock/ejector unit attachable to a printed wiring board preferably at top and bottom such that when the printed wiring board is inserted into its top and bottom guiding slots for connection to the mother board, the lock/ejector units will mesh with its "body foot 38 into rack slots at the top and bottom and whereby finger pressure on the lock/ ejectors will further provide a leverage action to force the printed wiring board further into the guide slot and into a solidity of connection with the connectors on the backplane mother board.

After insertion of the printed wiring board, upper and lower bowed snap lock units are depressed in order to lock the printed wiring board into place with continuing pressure from the two lock feet on the bowed snap locks.

For ejection of the printed wiring board, the movable snap locks are unsnapped to release the tension against the rack face (top and bottom), after which the leverage of the bowed lock unit in its upraised position can be rotated to cause pressure against the printed wiring board so as to cause a disconnection of the electrical connectors and the sliding outward of the printed wiring board in its guide slot.

DESCRIPTION OF PREFERRED EMBODIMENT

Figure 1:
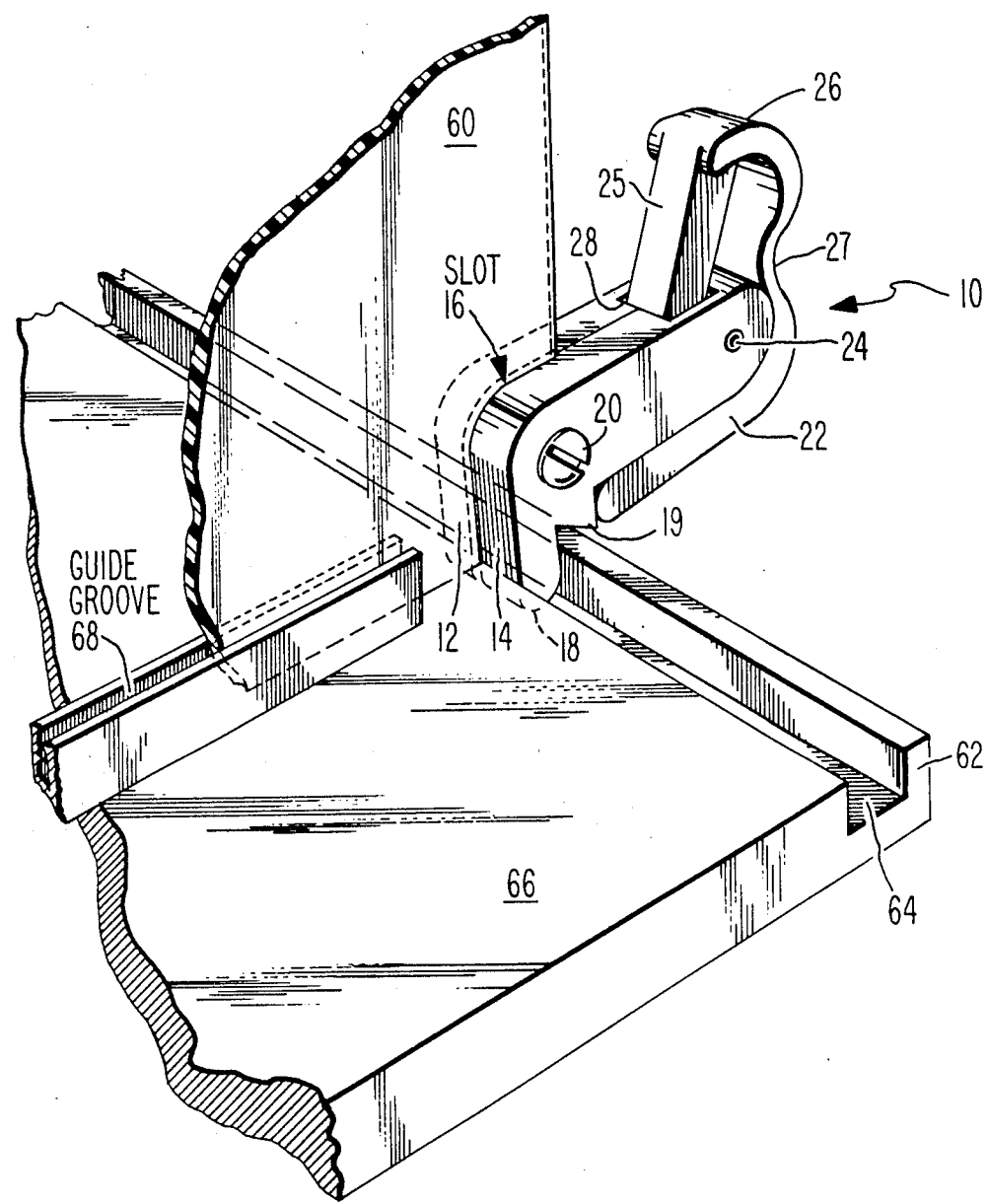
FIG. 1 is an isometric drawing showing the lock/ejector assembly device attached to a printed wiring board in a support rack.

Referring to FIG. 1 there is seen the lock/ejector device 10. The body of the lock/ejector is made up of two detachable halves which are shown as the first body half 12 and the second body half 14. These body halves are held together with a holding screw 20 and a cylindrical retainer 24 for the body halves 12 and 14.

Between the two body halves 12 and 14 there is provided a slot 16 into which there is inserted the printed wiring board 60 which is held by the holding screw 20 between the two body halves. The lock/ejector device 10 is mounted at the top and bottom of each printed wiring board as shown in FIG. 5.

The mounting rack 66 for the digital module is seen as having card guides 68 (FIGS. 1, 5) in order to guide an inserted printed wiring board card 60 precisely toward the backplane mother board. The rack 66 of FIG. 5 is also provided with two rack slots 64 (top and bottom) having rack edges 62.

Figure 5:
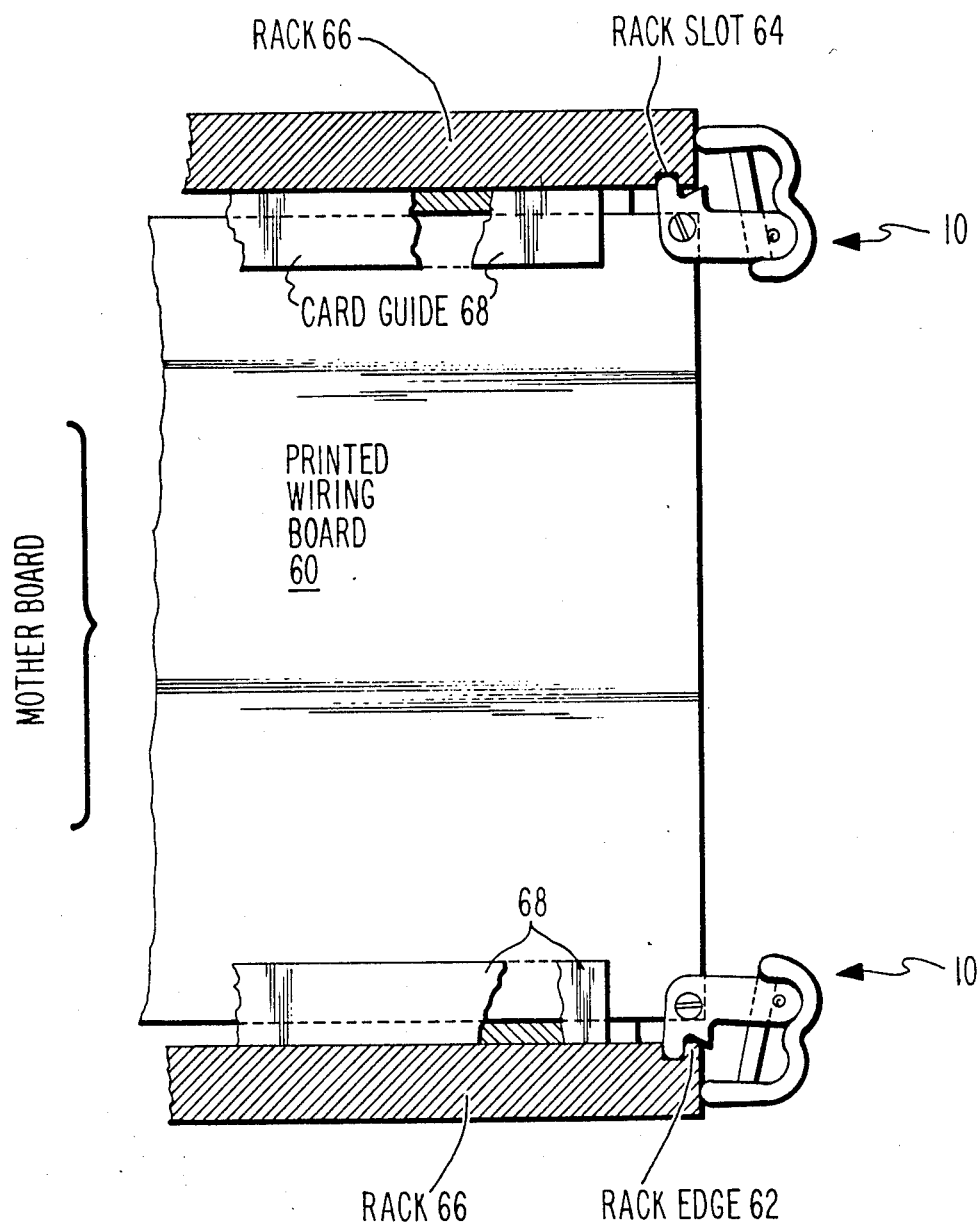
FIG. 5 is an illustration showing the preferred usage whereby an upper and lower lock/ejector assembly is applied to each printed wiring board at the outer edges.

The lock/ejector device 10 is formed to provide a body foot 18 which is sized so as to fit and slip into the rack slot 64, FIGS. 1 and 5.

Since the entire lock/ejector assembly device is pivotable around the holding screw 20, the body foot 18 can be slipped into or out of the rack slot 64. A wedge shaped cam-boss 19 is so designed as to make contact with the rack edge 62. When the printed wiring board is pushed inward into the card guide 68, this causes the lock/ejector body assemblies (upper and lower) to pivot and position the body feet 18 into the rack slots 64.

Figure 4:
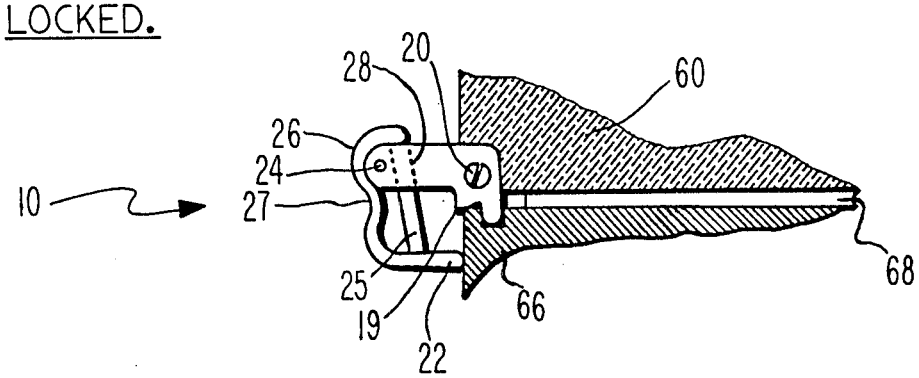

At the outer end of the lock/ejector device 10 there is provided a body slot 28 into which there is placed a bowed snap lock 26. This snap lock 26 is provided with a contoured bend 27 which has a certain amount of flexibility so that the entire snap lock can be pushed into a locking position, whereby the lock foot 22 will press against the front of the rack edge 62 (FIG. 4). A similar lock/ejector device mounted at the upper corner (FIG. 5) of the board will be locked against the upper rack slot 64.

The position shown in FIG. 1 for the bowed snap lock 26 is that of the unlocked position before the snap lock 26 has been pressed down into its locked position as will be seen in FIG. 4. FIG. 5 shows the preferred arrangement whereby the upper and lower lock/ejector assemblies duplicate each other and cooperate to lock-in or eject the board 60.

Figure 3:
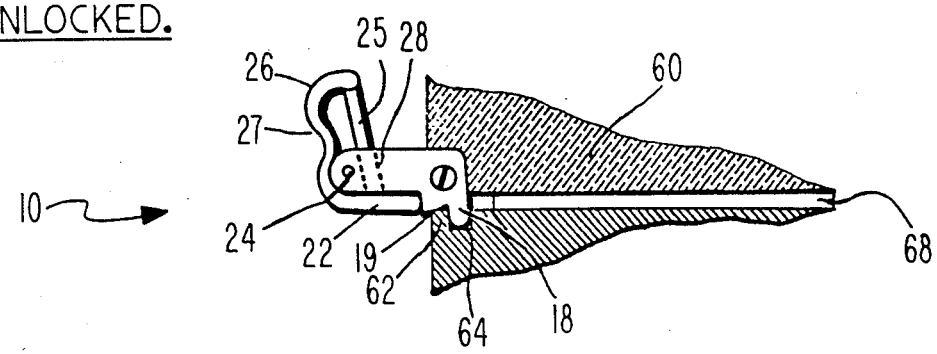

On the outer end of the body assembly there is a body slot 28 into which the forward arm 25 (of snap lock 26) can glide-through so that the snap lock 26 can be locked in the "upper unlocked position" or moved to the "lower locked position" as will be seen in FIGS. 3 and 4.

Figure 2:
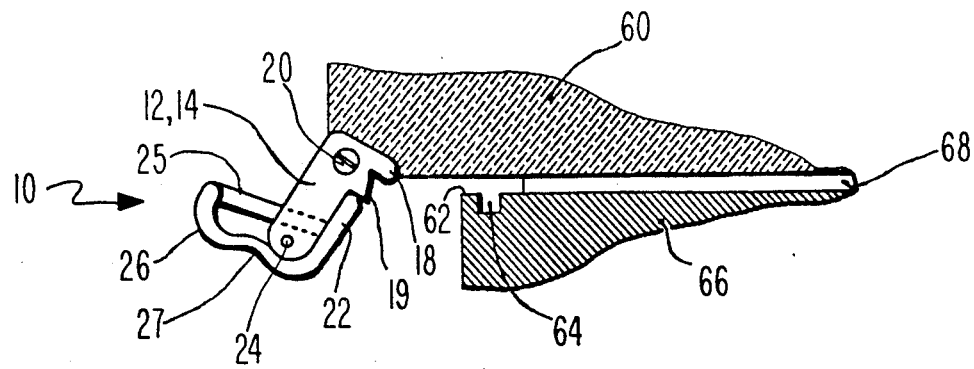
FIGS. 2, 3, 4 are a sequence of illustrations showing how the lock/ejector assembly cooperates with the support rack, the rack edge and rack slot.

Referring now to FIGS. 2, 3 and 4, there will be seen a sequence of drawings which show the functional operation of the lock/ejector assembly device in practical operation.

Referring to FIG. 2, the lock/ejector assembly device 10 is shown pivotally attached to the printed wiring board 60 by means of the holding screw 20. The printed wiring board 60 is then pressed inwardly along the card guide 68. In this condition, the assembly device 10 is shown in its unlocked position with the snap lock 26 in its "unlocked" orientation.

Then, as will be seen in FIG. 3, the rack edge 62 will come into contact with the cam-boss 19, causing the assembly device 10 to pivot so that the body foot 18 will now move into the rack slot 64, thus providing a stable footing to hold the printed wiring board 60 into position.

As further seen in FIG. 3, the snap lock 26 has a forward arm 25 and a contoured bow 27, which is made preferably of a plastic material such as Teflon, having a flexibility and resiliency to maintain its structural configuration.

The following discussion of FIGS. 3 and 4 is also applicable to FIG. 5 showing both the upper and lower lock/ejector devices.

Now, to further stabilize and solidify the holding power of the assembly, the unlocked condition shown in FIG. 3 is changed to the locked position which is shown in FIG. 4. As will be seen in FIG. 4, the snap assemblies 26 are now pressed so that the forward arm 25 slides through the body slot 28 in such a fashion that the lock foot 22 now presses with tension against the rack face 66, thus providing a firm, solid and continuous pressure which will hold the printed wiring board 60 in its groove 68 and keep it free from vibration and jarring.

It will further be noted that the contoured bend 27, due to the nature of the Teflon spring action, now operates to lock the body foot 22 against the rack 66.

There has hereinbefore been described the functions involved in the "insertion" of a printed wiring board into a card guide, whereby the printed wiring board can then be leveraged into a solid connection with the back connectors of a mother board and thus kept free from vibration and unstable connections.

In the reverse situation, when it is desired to "remove" the printed wiring board and to overcome the resistance and friction of sometimes possibly 200 or more connections to the mother board, the reverse operative situation is now used.

In order to cleanly and efficiently remove the printed wiring board 60 from its connection to the mother board (and from its card guides), the snap lock 26 of FIG. 4 can be subjected to a finger pressure whereby the snap lock 26 is moved into the "unlocked position" shown in FIG. 3. Here, it will be seen that the lock foot 22 has now been removed away from the rack 66 and placed into a position behind and level to the cam-boss 19. Then, due to the action of the contoured bend 27, the snap lock 26 will now be "snapped" in its unlocked position and held there by the contoured bend 27.

At this stage in FIG. 3, the upper and lower assemblies 10 of FIG. 5 and their respective snap locks 26 can be grasped by the fingers and used as highly responsive levers which pivot on the holding screws 20. Thus, by applying this leverage pressure, the body feet 18 will press against the upper and lower rack slots 64 to disengage the printed wiring board 60 causing it to move in the outward direction, thus disconnecting the multiple connectors from the mother board, whence the board can be easily pulled out along the card guides and removed.

The provision of a movable lock foot (22) which "snap-locks" itself in both the "locked" position of the assembly device 10 and in the "unlocked" position of the assembly device 10, using a flexible material having a center bow contour, permits the desired lock/ejection functions in a simple, efficient manner.

There has herein been described an inexpensive and easily assembled lock/ejector assembly device, sets of which are attachable to upper and lower edges of printed wiring board in order to provide a simple finger-efficient means whereby the board may be locked into place and kept free from vibration or disconnection, while yet maintaining solid contacts with the mother board. Likewise, the assembly devices 10 may be operated to break the board-to-mother board connections and permit the removal of the printed wiring board in a very simple and efficient manner using only finger pressure and the leverage provided by the assembly devices.

While a specific embodiment of the invention has been described in practical application, it can be understood that other variations of the lock/ejector assembly device may be provided which still fall within the scope of the invention as defined in the following claims.

What is claimed is:

1. In an apparatus for facilitating the insertion/ejection of a printed wiring board into a card guide for connection to a mother board, whererby said card guide is held by a rack having a rack edge and a rack slot, a lock/ejector assembly comprising:
   (a) a leverage body pivotally connected to said printed wiring board and including:
      (a1) a cam-boss for contacting a rack edge;
      (a2) a leverage body foot for insertion into said rack slot when said cam-boss contacts said rack edge;
      (a3) means for tensionally locking said leverage body and said wiring board against said rack edge, wherein said means for locking includes:

(i) a bowed snap lock having a forward arm attached to a flexibly-bowed contoured-bend arm; and (ii) said flexibly-bowed contoured-bend arm provides an extended lock foot capable of being pressured-positioned against said rack edge;

(a4) a transverse body slot for guiding said forward arm of said bowed snap lock.

2. The assembly of claim 1, wherein said means for locking further includes;

(a) an unlocked position wherein said forward arm is upraised an holds said extended lock foot against said leverage body;

(b) a locked position wherein said forward arm is pushed down and extends said lock foot against said rack edge.

3. The lock/ejector assembly of claim 2, wherein said leverage body further includes:

(a) a first body-half;

(b) a second body-half juxtaposed against said first body-half;

(c) a slotted area between said first and second body halves permitting insertion of one edge of said printed wiring board.

4. The lock/ejector assembly of claim 3, wherein said leverage body includes:

(a) holding screw means for attaching said printed wiring board between said first and second body-halves.

5. In a rack unit having guiding grooves for guiding printed wiring boards into connection with a mother board wherein said rack unit provides a front rack slot and front rack edge, a printed wiring board assembly device for locking a printed wiring board in a rack to its mother board and for easily disconnecting and ejecting said printed wiring board, said assembly device comprising:

(a) an elongated lever body means pivoted to said printed wiring board and acting as a leverage device, wherein said lever body means includes:

(a1) a transverse slot for guiding a snap lock means between its locked and unlocked position;

(b) means for engaging said rack edge for impelling a body foot into a rack slot;

(c) said body foot connected to said lever body means for insertion and engagement into a rack slot;

(d) said snap lock means attached to said lever body means and having an unlocked and a locked position, whereby in said locked position said snap lock means exerts a stabilizing pressure against said rack unit, wherein said snap lock means includes:

(d1) a forward extension arm, being guided by said transverse slot, and having first and second ends;

(d2) a bowed flexible arm connecting the said ends of said extension arm and operating to lock said snap lock means against said lever body means.

* * * * *